United States Patent [19]

Fukuda

[11] Patent Number: 4,823,088
[45] Date of Patent: Apr. 18, 1989

[54] METHOD OF AND APPARATUS FOR TESTING SEMICONDUCTOR DEVICE FOR ELECTROSTATIC DISCHARGE DAMAGE

[75] Inventor: Yasuhiro Fukuda, Tokyo, Japan

[73] Assignee: Oki Electric Industry Co., Ltd., Tokyo, Japan

[21] Appl. No.: 42,424

[22] Filed: Apr. 24, 1987

[30] Foreign Application Priority Data

May 9, 1986 [JP]  Japan ................................ 61-104720

[51] Int. Cl.⁴ ..................... G01N 27/60; G01R 31/26
[52] U.S. Cl. .................................. 324/456; 324/452; 324/158 R; 361/225
[58] Field of Search ................... 324/452, 456, 158 R; 361/225

[56]  References Cited

U.S. PATENT DOCUMENTS 4,636,724  1/1987  Fukuda et al. ................. 324/158 R

FOREIGN PATENT DOCUMENTS 0080577  5/1982  Japan ............................ 324/158 R
0231458  12/1984  Japan ............................ 324/158 R

*Primary Examiner*—Reinhard J. Eisenzopf
*Assistant Examiner*—Jack B. Harvey
*Attorney, Agent, or Firm*—Wenderoth, Lind & Ponack

[57]  ABSTRACT

A method of testing the susceptibility of a semiconductor device having a dielectric package to withstand electrostatic charges charged on the dielectric package, comprising the steps of: connecting a switch in between input/output terminals of the semiconductor device and a reference potential source, applying a prescribed potential to the surface of the dielectric package to charge the surface with electric charges while the switch is in an open state, applying a prescribed potential to a terminal of the semiconductor device via a resistor, and discharging the charges to the reference potential source by closing the switch.

13 Claims, 10 Drawing Sheets

METHOD OF AND APPARATUS FOR TESTING SEMICONDUCTOR DEVICE FOR ELECTROSTATIC DISCHARGE DAMAGE

BACKGROUND OF THE INVENTION

1. Field of the Invention

The present invention relates to a method of and an apparatus for testing the electrostatic breakdown of a semiconductor device and for thereby securely and stably monitoring electrostatic breakdown with use of the charged device model damaged due to electrostatic charges stored on a dielectric package of the semiconductor device.

2. Description of the Prior Art

Conventionally, some methods are known for testing the electrostatic breakdown of a semiconductor device, such as the charged person method assuming the human body model, and the charged device method and the charged package method assuming the charged device model. The electrostatic breakdown on a user side generally occurs on the charged device model because, with the progress of fine semiconductor devices, MOS devices for example have come to have a gate oxide film more reduced in its thickness, and processes of fabricating such a semiconductor device are advanced in their automation.

Figure 1:
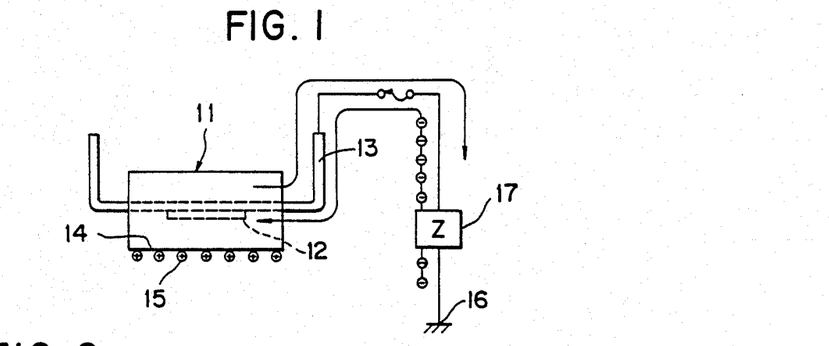
FIG. 1 is a schematical view illustrating a charged device model.

The charged device model is described with reference to FIG. 1. In the figure, electrostatic charges 15 have been stored on a package surface 14 of a semiconductor device 11. With an input/output terminal 13 being connected to a discharge entity 17, the electrostatic charges are moved from a ground terminal 16 via the discharge entity 17, thereby a discharge current is induced. The induced discharge current damages a semiconductor chip 12.

In the following, a testing method by the charged package method will be described.

Figure 2:
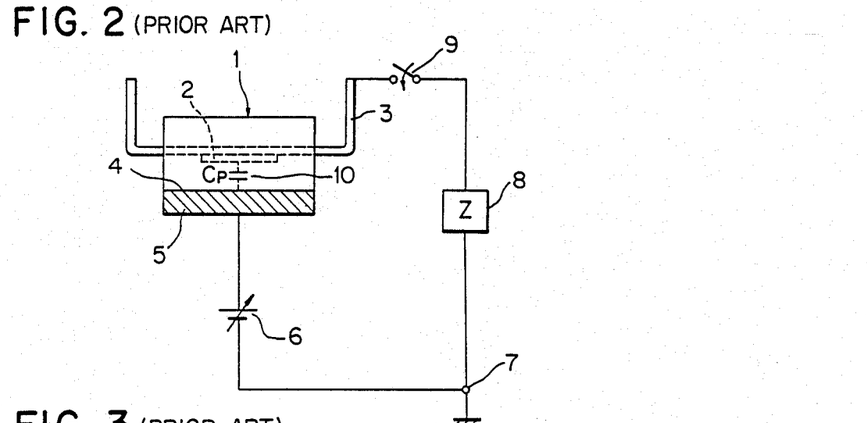
FIG. 2 is a schematic view showing a conventional electrostatic breakdown testing apparatus according to the charged package method.
Figure 2:
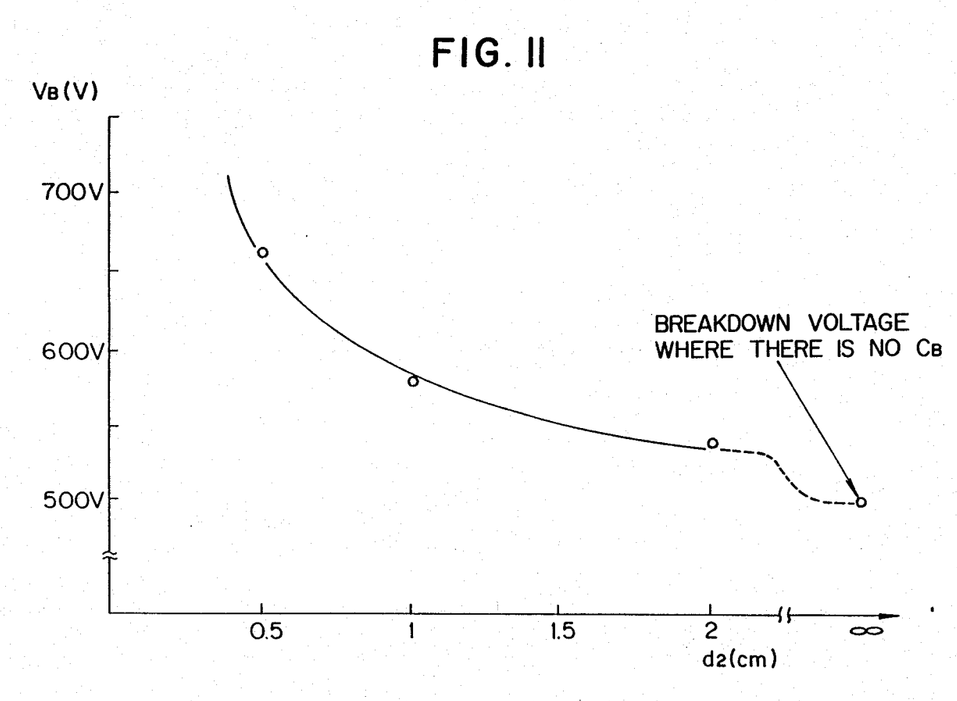

As shown in FIG. 2, designated at 1 is a semiconductor device to be tested enclosed in a plastic package, such as a MOS IC device, 2 is a semiconductor chip, 3 is an input/output terminal being an electrode of the semiconductor device 1 external thereto, 4 is a surface of the package, 5 is a metal electrode disposed in contact with the package surface 4, 6 is a DC voltage source for supplying voltage to the metal electrode 5, 7 is a reference potential electrode, 8 is load impedance, 9 is a switch connected between the input/output terminal 3 and the impedance 8, and 10 is package capacitance $C_p$ being the electrostatic capacitance between the semiconductor chip 2 and the metal electrode 5.

In the testing operation, first the switch 9 is opened. Then prescribed voltage is applied to the package surface 4 via the metal electrode 5, with the semiconductor device 1 being insulated from the reference potential electrode 7. In succession, the switch 9 is closed after the lapse of prescribed time, and input/output terminal 3 is electrically connected with the reference potential electrode 7 via the impedance 8, whereby electric charges are stored on the package capacitance $C_p$ 10. With a current forced as such to flow into the semiconductor chip 2 for storing the electric charges on the package capacitance $C_p$ 10, an equivalent phenomenon to the charged device model is produced.

Thereafter, a determination is made as to whether or not the semiconductor device 1 is damaged.

Figure 3:
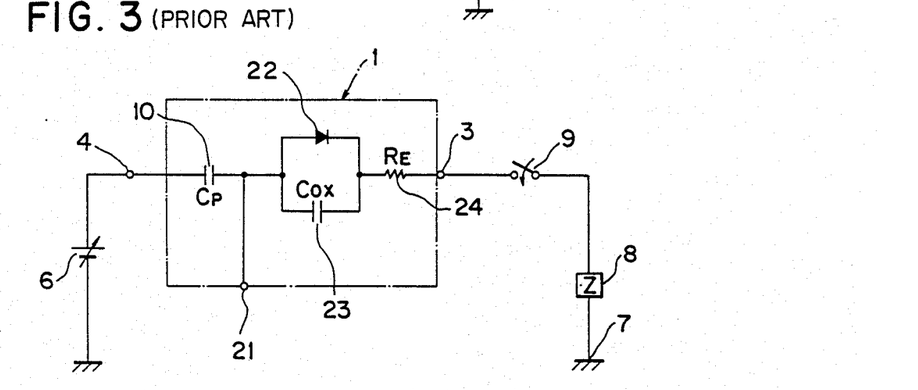
FIG. 3 is an equivalent circuit diagram of the conventional apparatus.

FIG. 3 is an equivalent circuit diagram of the conventional apparatus in FIG. 2. As shown in the FIGURE, the circuit of the MOS IC device 1 is represented by an input protective diode 22, a capacitance $C_{ox}$ 23 of a gate-insulating film of a MOS transistor and input protective resistance $R_E$ 24. Designated at 21 is a voltage source terminal. Other elements are given the same numbers as those shown in FIG. 2.

A testing method is often employed which supposes the discharge entity to be metal in general, and hence eliminates the impedance 8 and directly connects electrically between one end of the switch 9 and the reference potential electrode 7. Therefore, the description of the impedance 8 will hereinafter be omitted.

Figure 4:
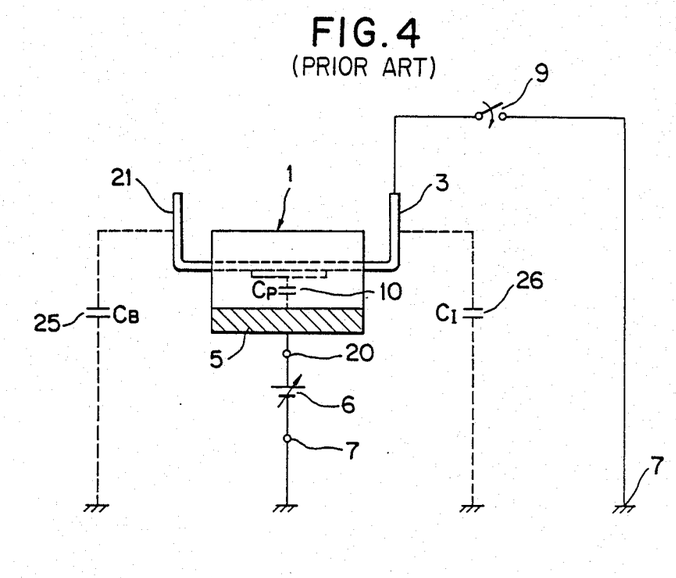
FIG. 4 is a schematic view showing the conventional apparatus taking back capacitance and input/output capacitance into consideration.

However, upon actual testing of the semiconductor device 1, there is an electrostatic capacitance $C_B$ (hereinafter referred to as back capacitance) between the ground and the power source terminal 21 and an electrostatic capacitance $C_I$ (hereinafter referred to as input/output capacitance) between the ground and the input/output terminal 3, as shown in FIG. 4. Accordingly, even if a prescribed voltage is applied to the package surface 4, the potential of the power source terminal 21 and the input/output terminal 3 varies and hence it is difficult to reliably test the semiconductor device 1.

First, influence of the input/output capacitance $C_I$ will be described.

Figure 5:
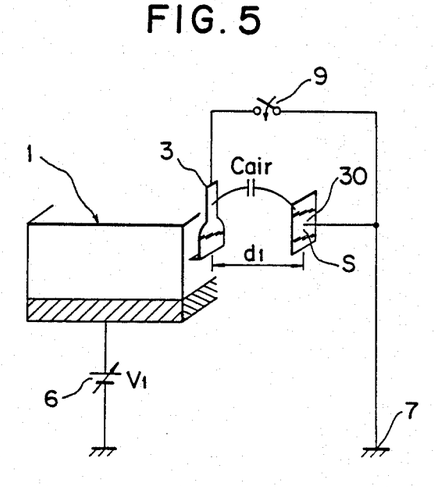
FIG. 5 is a view explaining input/output capacitance.

Upon executing electrostatic breakdown testing for the semiconductor device 1 by use of the charged package method as shown in FIG. 5, the following relation holds between electrostatic capacitance $C_{air}$ of an air gap existing between a casing piece 30 of a test apparatus and the input/output terminal 3 when the casing piece 30 is present in a confronting relation with the input/output terminal 3:

$$C_{air} = (\epsilon_0 \times \epsilon_s \times S)/d1$$

$$\approx (8.855 \times 10^{-14} \times S)/d1 \quad (1)$$

Here, $\epsilon_0$ is the vacuum dielectric constant and $\epsilon_s$ is a specific dielectric constant of air which is approximately 1. S is an area of the input/output terminal facing to the casing piece 30, which is represented in cgs units (the same shall be applied hereinafter).

Figure 6:
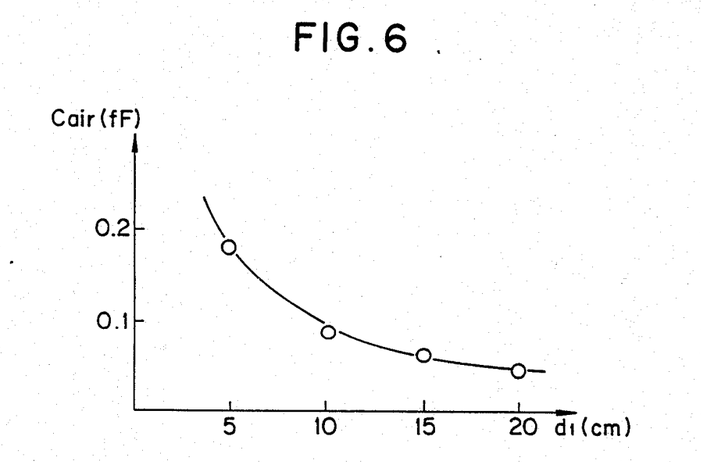
FIG. 6 is a graph showing the relationship between the distance d1 and the air gap capacitance Cair in FIG. 5.

Here, supposing $S = 2 \, m/m \times 5 \, m/m = 10^{-2} \, cm^2$, the relation between the electrostatic capacitance $C_{air}$ (fF) and the facing distance d1 (cm) described above is as illustrated in FIG. 6.

Moreover, the electrostatic capacitance $C_{air}$ corresponds to electrostatic capacitance $C_I$ in an equation (2) described later.

Figure 7:
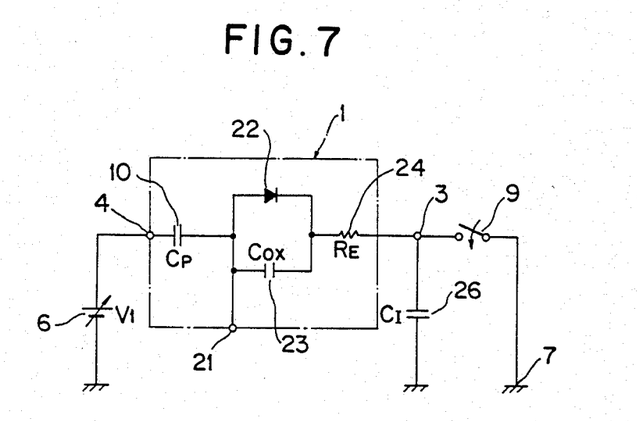
FIG. 7 is an equivalent circuit diagram of the conventional apparatus taking the input/output capacitance into consideration.

FIG. 7 is an equivalent circuit diagram of the conventional apparatus taking the input/output capacitance $C_I$ into consideration. As shown in the FIGURE, an applied voltage $V_{cox}$ to the oxide film capacitance $C_{ox}$ 23 when applying prescribed voltage $V_1$ from the DC voltage source 6 with the switch 9 kept opened is generally expressed as:

$$V_{cox} = \frac{C_p}{C_p + C_{ox} + (C_{ox}C_p/C_I)} V_1. \quad (2)$$

Accordingly, in the example shown in FIG. 5, $$V_{cox} = \frac{C_p}{C_p + C_{ox} + (d1 C_{ox} C_p / 8.855 \times 10^{-16})} V_1$$

holds.

Figure 8:
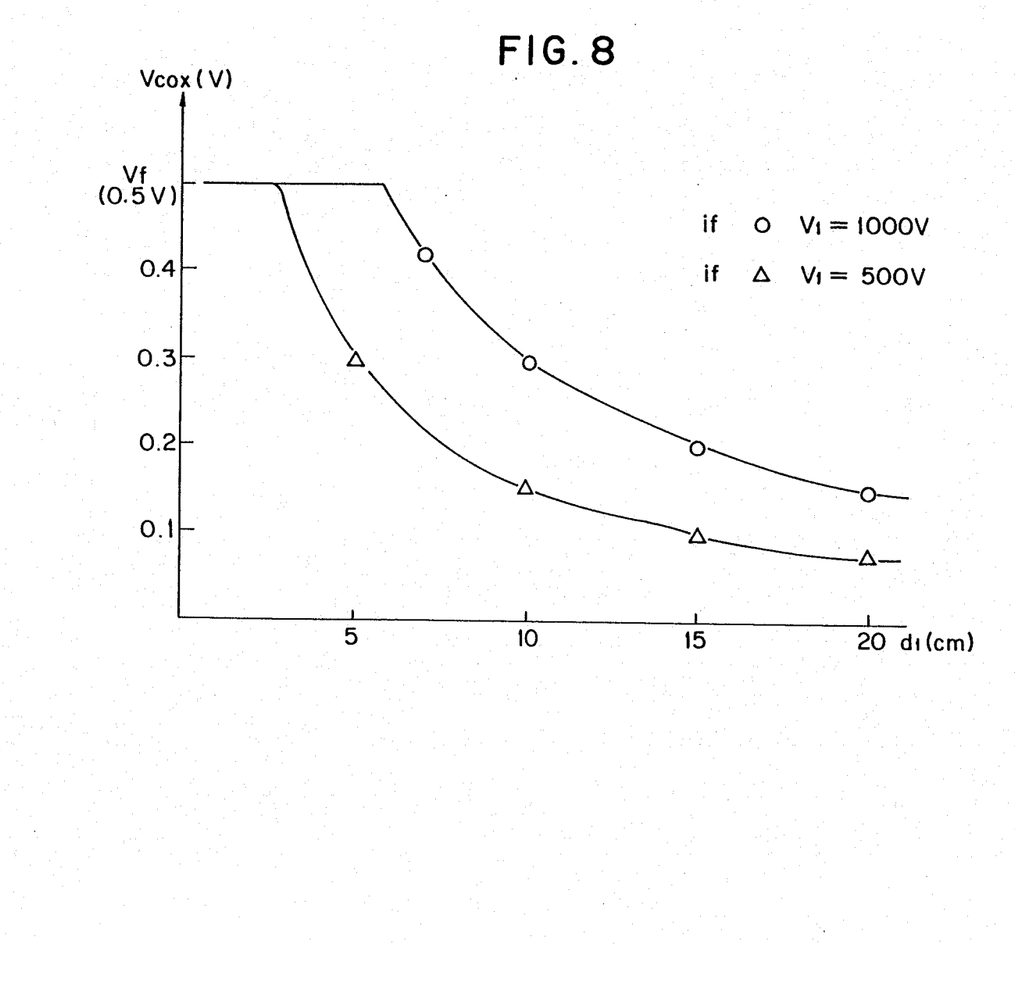
FIG. 8 is a graph showing the relationship between the distance d1 and the voltage applied to oxide film capacitance in FIG. 5.

Supposing here that the semiconductor device is a 24 pin-DIP plastic packaged semiconductor device, Cp can be assumed to be 7.1 pF (shown in THE PROCEEDINGS OF IEEE INTERNATIONAL RELIABILITY PHYSICS SYMPOSIUM 19th, 1981, pp. 193-199). Assuming here that the oxide film capacitance Cox is approximately 0.3 pF, the equation (2) is changed to $$V_{cox} \approx [7.1/(7.4+2405.4d1)] \cdot V_1 \quad (3)$$

and a relation between the facing distance d1 and the voltage applied to the oxide film capacitance Cox 23 is given as shown in FIG. 8.

Hereupon, forward threshold voltage Vf of the diode 22 of FIG. 7 is assumed 0.5 V.

According to FIG. 8, the diode 22 of FIG. 7 is switched on only by allowing the casing piece 30 of its area S of 2 m/m×5 m/m to approach the input/output terminal 3 to about 6 cm therefrom when $V_1 = 1000$ V and to about 3 cm therefrom when $V_1 = 500$ V. Little transient voltage is applied to the oxide film capacitance Cox 23 even if the switch 9 is closed in the above situation and prevents oxide film breakdown from being produced. It can therefore be confirmed that the electrostatic breakdown voltage of the semiconductor device 1 against the electrostatic breakdown measured on the basis of the charged package method shown in FIG. 7 is sharply varied by the distance between the casing piece 30 and the input/output terminal 3.

The example described above attributed the electrostatic capacitance Cair to the air gap formed between the casing piece 30 and the input/output terminal 3 as the input/output capacitance $C_I$ 26. However, provided the testing is effected on a metallic table, air gap electrostatic capacitance between the table and the input/output terminal 3 also acts as the input/output capacitance $C_I$. Accordingly, electrostatic breakdown voltage data of the semiconductor device 1 is altered furthermore depending on the shape and size of the table.

The influence of the input/output capacitance $C_I$ will now be described.

Figure 9:
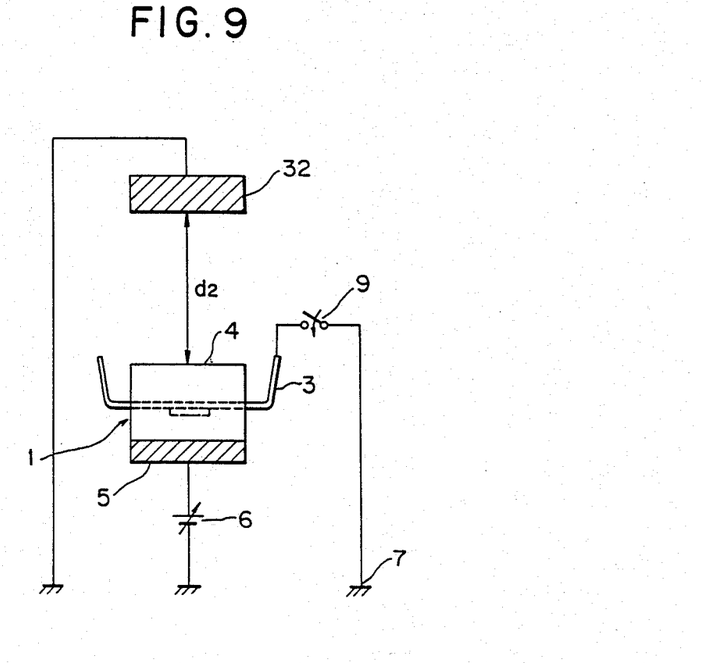
FIG. 9 is a view explaining back capacitance.

As shown in FIG. 9, a metal piece 32 corresponding to part of a casing of the testing apparatus fixed to the ground potential is placed in close vicinity of the package surface 4 at a distance d2 therefrom. The metal piece 32 has an area of 10 mm by 10 mm, for example. Back capacitance $C_B$ exists between the metal piece 32 and the source terminal 21 of the semiconductor device 1.

Figure 10:
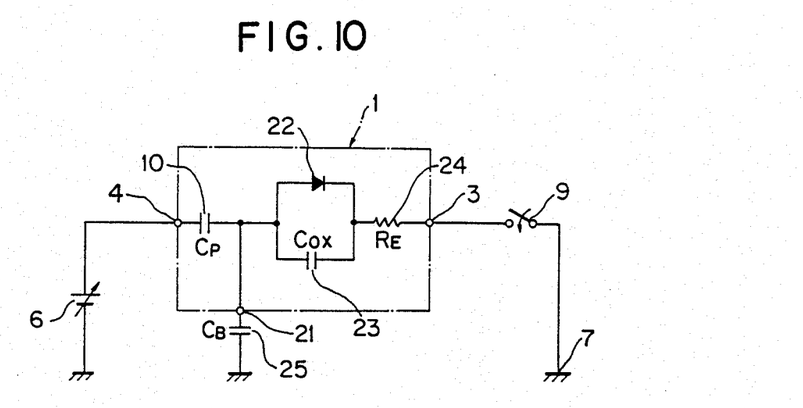
FIG. 10 is an equivalent circuit diagram of the conventional apparatus taking the back capacitance into consideration.

FIG. 10 shows an equivalent circuit of the testing apparatus taking the back capacitance into consideration. Applied voltage $V_s$ to the voltage source terminal 21 of the semiconductor device 1 satisfies in general:

$$V_s = [C_p/(C_B+C_p)] \cdot V_1 \quad (4)$$

when the DC voltage source 6 is set to prescribed voltage $V_1$ and the switch 9 is opened.

In equation (4), with the increasing back capacitance $C_B$, the voltage $V_s$ at the source terminal 21 is reduced. Thereby, when closing the switch 9, voltage Vcox applied to the gate oxide film capacitance Cox of the MOS transistor is lowered after a prescribed time constant to prevent the oxide film from being damaged.

The voltage of the DC power source 6, as the maximum transient voltage is applied to the oxide film capacitor COX 23 after the switch 9 is closed, to thereby damage the oxide film is expressed by:

$$V_B = V_{cox}(\tau) \frac{Cox + C_B + C_p}{C_p} \left\{ 1 - e^{-\frac{\tau}{R_E}[\frac{Cox+CB+Cp}{cox(CB+Cp)}]} \right\}^{-1} \quad (5)$$

Here, e is the base of the logarithm, $\tau$ is the response time of the diode 22, and Vcox($\tau$) is the voltage applied to the oxide film capacitor Cox 23 when the diode 22 responds.

Thereupon, a showing of the relationship between the distance d2 and the breakdown voltage $V_B$ by use of the equation (5) is given in FIG. 11. Here, a 16 pin-DIP type plastic encapsulated semiconductor device is employed for the test and Cp=0.5 pF is assumed. Additionally, Cox=0.3 pF, $\tau$=1 nsec, $R_E$=1000Ω. The breakdown voltage is 500 V when the back capacitance $C_B$=0.

As evidenced from FIG. 11, a breakdown voltage $V_B$ of 670 V when the distance d2 is 0.5 cm represents an increase of no less than 34%. Moreover, upon executing the above testing at a distance d2 varying within 1 cm±0.5 cm, the breakdown voltage $V_B$ is altered from 670 V to 550 V even if the same semiconductor device is employed. In fact, it is common that a larger grounding metal piece exists near where the testing in concern is executed, and hence the back capacitance $C_B$ is also increased together with the width of the variation.

Accordingly, upon effecting the electrostatic breakdown testing for the semiconductor device, judgement varies due to the changes of the back capacitance $C_B$ and the input/output capacitance $C_I$. It is therefore difficult to execute electrostatic breakdown testing of a semiconductor device with good reproducibility and with high reliability.

SUMMARY OF THE INVENTION

It is an object of the present invention to provide a method and apparatus for electrostatic breakdown testing of a semiconductor device, which sufficiently takes into consideration the back capacitance $C_B$ and the input/output capacitance $C_I$ and which assures excellent reproducibility and high reliability upon effecting the electrostatic breakdown testing.

Figure 12:
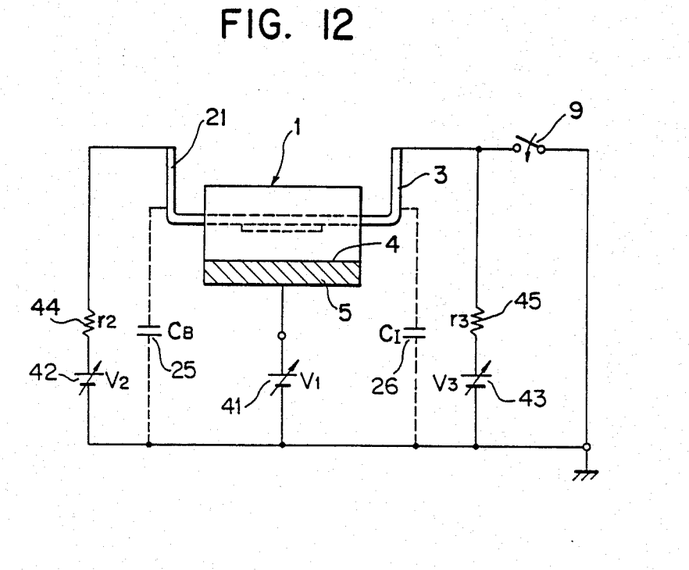
FIG. 12 is a schematic view showing an electrostatic breakdown testing apparatus according to the present invention.

As shown in FIG. 12, the method according to the present invention comprises the steps of:

(a) supplying voltage $V_1$ from a first DC voltage source 41 to the metal electrode 5 disposed in contact with the package surface 4 of the semiconductor device 1 to be tested, (b) supplying voltage $V_3$ from a third DC voltage source 43 to the input/output terminal 3 of the semiconductor device 1 via a resistance r3, and (c) supplying voltage $V_2$ from the second DC voltage source 42 to the power source terminal 21 of the semiconductor device 1 via an another resistance r2.

In addition, each voltage described above may be applied only to the input/output terminal or the source terminal.

The above object, features and advantages of the present invention will become more apparent from the following description when taken in conjunction with the accompanying drawings in which preferred embodiments of the present invention is shown by way of illustrative example.

BRIEF DESCRIPTION OF THE DRAWINGS

FIG. 11 is a graph showing the relationship between the distance d2 and the breakdown voltage $V_B$ in FIG. 9;

DESCRIPTION OF THE PREFERRED EMBODIMENT

An embodiment of electrostatic breakdown testing for a semiconductor device according to the present invention will now be described with reference to the accompanying drawings.

Figure 13:
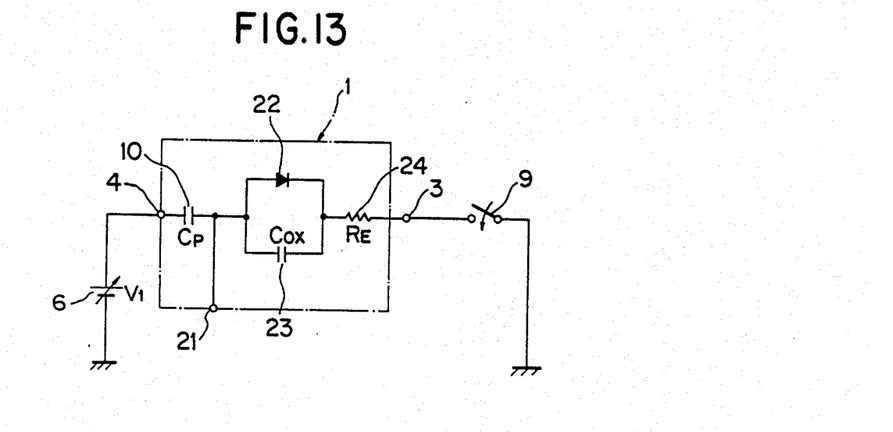
FIG. 13 is an equivalent circuit diagram of an ideal testing apparatus according to the charged package method.
Figure 14:
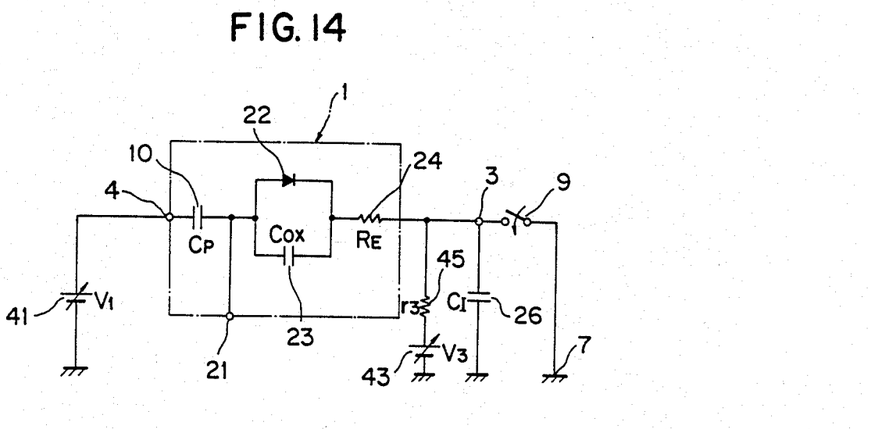
FIG. 14 is an equivalent circuit diagram of the apparatus taking the input/output capacitance into consideration according to the present invention.

FIG. 13 is an equivalent circuit diagram of an ideal testing apparatus according to the charged package method. In the figure, even if the DC voltage source 6 is set to prescribed voltage $V_1$ and switch 9 is kept opened, voltage Vcox applied to the oxide film capacitance Cox 23 is zero provided the input/output capacitance $C_I$ 26 (refer to FIG. 7) is nonexistent. When closing the switch 9 in this situation, electric charges are stored on the oxide film capacitance Cox 23 during the response time of the diode 22 from off-state to on-state thereof, and the voltage Vcox is thereby increased and the oxide film is damaged. The voltage Vcox thereupon is increased much more than the threshold voltage Vf of the diode 22. Hereupon, to permit the same voltage to be applied to the oxide film capacitance Cox 23 after closing the switch 9 even if the input/output capacitance C1 26 is existent and varies, a testing equivalent circuit is constructed as shown in FIG. 14. Namely, a third DC voltage source 43 is connected to the input/output terminal 3 of the semiconductor device 1 via a resistance $r_3$ 45. With the switch 9 kept opened, a first DC voltage source 41 is set to prescribed voltage $V_1$ and the third DC voltage source 43 set to prescribed voltage $V_3$. At this time, the voltage V cox applied to the oxide film capacitance Cox 23 is as follows:

$$V\text{cox} = [C_p/(C_p + C\text{ox})] \cdot (V_1 - V_3) \qquad (6)$$

But, when Vcox is in excess of the threshold voltage Vf of the diode 22, Vcox=Vf holds.

Hereupon, when executing ideal electrostatic breakdown testing of the semiconductor device based on the charged package method shown in FIG. 13, setting $V_1 = V_3$ causes Vcox=0.

On the other hand, upon executing the testing when specific input/output capacitance $C_1$ is existent, the voltage $V_3$ may be set as follows:

$$V_3 = \frac{C\text{ox}C_p}{C_pC\text{ox} + C_IC\text{ox} + C_IC_p} V_1 \qquad (7)$$

$$[\text{if } \frac{C_IC_p}{C_pC\text{ox} + C_IC\text{ox} + C_IC_p} V_1 < Vf]$$

$$V_3 = \frac{C_p}{C_p + C_I} (V_1 - Vf) \qquad (8)$$

$$[\text{if } \frac{C_IC_p}{C_pC\text{ox} + C_IC\text{ox} + C_IC_p} V_1 > Vf]$$

where, Vf is the threshold voltage of the diode 22. Moreover, the level of the resistance $r_3$ 45, being more than that of the protective resistance $R_E$ 24, does not affect a transient voltage applied to the oxide film capacitance Cox after closing the switch 9.

Figure 15:
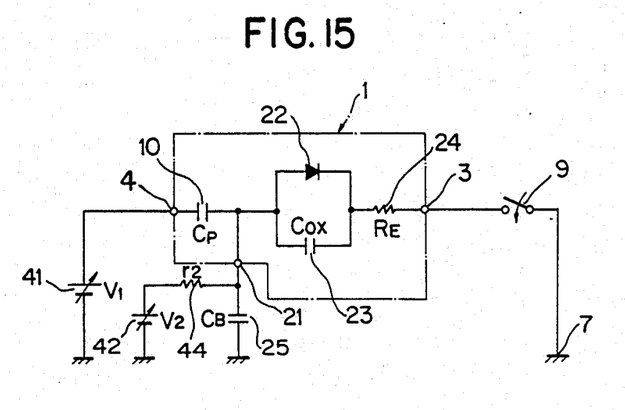
FIG. 15 is an equivalent circuit diagram of the apparatus taking the back capacitance into consideration.

In succession, provided the back capacitance $C_B$ 25 is existent as shown in FIGS. 9 to 11, trouble is caused upon effecting the testing. Also in such a case, i.e., even if the back capacitance $C_B$ 25 is changed in various manners, test circuit arrangement shown in FIG. 15 may be employed for making the voltage $V_s$ of the source terminal 21 constant. Namely, a second DC voltage source 42 is connected to the source terminal 21 of the semiconductor device 1 via the resistance $r_2$ 44. Accordingly, with the switch 9 kept opened, the first DC voltage source 41 is set to prescribed voltage $V_1$ and the second DC voltage set to prescribed voltage $V_2$. Then, the voltage $V_s$ of the source terminal 21 of the semiconductor device 1 satisfies $V_s = V_2$ after the application of the voltage described above. Thereupon, when executing electrostatic breakdown testing of the semiconductor device by making use of the charged package method without the back capacitance $C_B$ 25 as shown in FIG. 13, setting the voltages $V_1$, $V_2$ so as to satisfy $V_1 = V_2$ causes $V_s = V_1$. Alternatively, upon executing the testing when specific back capacitance $C_B$ 25 is existent, it may be assured by setting the voltage $V_2$ as follows:

$$V_2 = [C_p/(C_B + C_p)] \cdot V_1 \qquad (9)$$

There is no difference between transient voltage wave forms, shown in FIGS. 15 and 10 applied to the oxide film capacitance Cox 23 until the diode 22 starts to respond after closing the switch 9 provided $r_2$ is selected in the range of $r_2 > 100\ R_E$, taking into consideration a fact that response time of a typical diode is less than several nanoseconds.

A current flowing through the diode 22, allows a DC current flowing from the DC voltage source 42 to the resistance $r_2$ 44—an input protective diode 22—an input protective resistance $R_E$ 24—reference potential electrode 7 to be added thereto. This phenomenon is ignored as the electrostatic breakdown testing for the semiconductor device provided the resistance $r_2$ is selected to be more than about $10^6 \Omega$.

Figure 16:
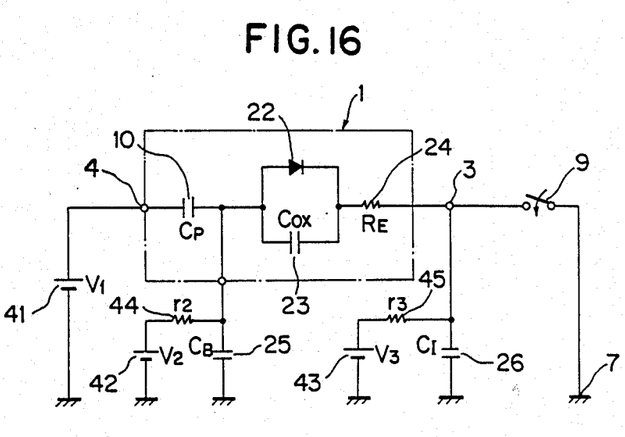
FIG. 16 is an equivalent circuit diagram of the apparatus taking the back capacitance and the input/output capacitance into consideration according to the present invention.

FIG. 16 shows a test circuit capable of stably executing electrostatic breakdown testing of a semiconductor device by the charged package method even if the input/output capacitance $C_I$ 26 and the back capacitance $C_B$ 25 both exist and vary. With set voltage values $V_1$, $V_2$, and $V_3$ of the respective DC voltage sources 41, 42, and 43 being set by the use of the above equations (6) through (9), test conditions of the charged package method desired to be executed can be prepared.

Figure 17:
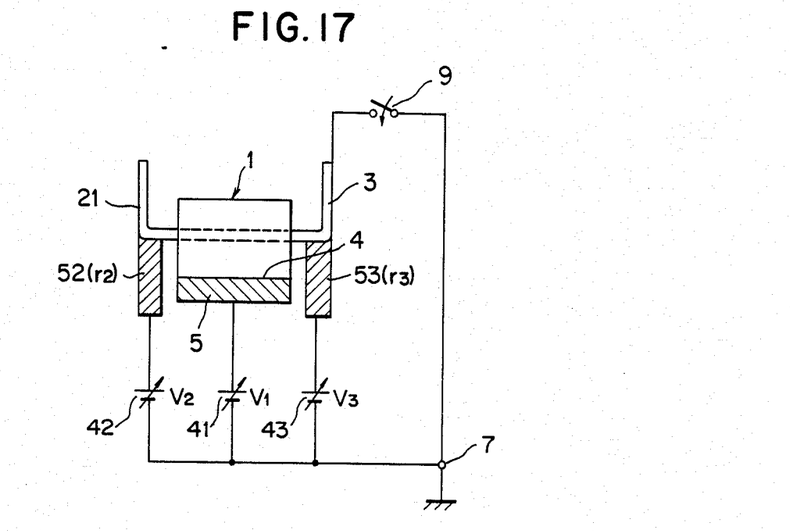
FIG. 17 is a schematic view showing an embodiment of the apparatus according to the present invention.

FIG. 17 is a schematic view showing an embodiment of the apparatus according to the present invention.

Prescribed voltage $V_1$ is applied to the package surface 4 of the semiconductor device 1 from the metal electrode 5 electrically connected with the first DC voltage source 41. Voltage $V_3$ is applied to the input/output terminal 3 through a resistor 53 electrically connected with the DC voltage source 43. The voltage $V_2$ is applied to the source terminal 21 through a resistor 52 electrically connected with the second DC voltage source 42. The resistance $r_2$ of the resistor 52 is selected so as to satisfy $r_2 > 100\ R_E$ based on FIG. 15.

Then, the reference potential electrode 7 and the input/output terminal 3 are short-circuited via the switch 9 for executing the electrostatic breakdown testing for the semiconductor device 1. For the switch 9, the reference potential electrode 7 may directly be brought into contact with the input/output terminal 3 or a mercury relay, a lead switch, a semiconductor switch and the like may be employed. For electrical connection between the resistor 53 and the input/output terminal 3, mere contact therebetween may also be allowed. The same will be applied also for electrical connection between the resistor 52 and the source terminal 21.

Figure 18:
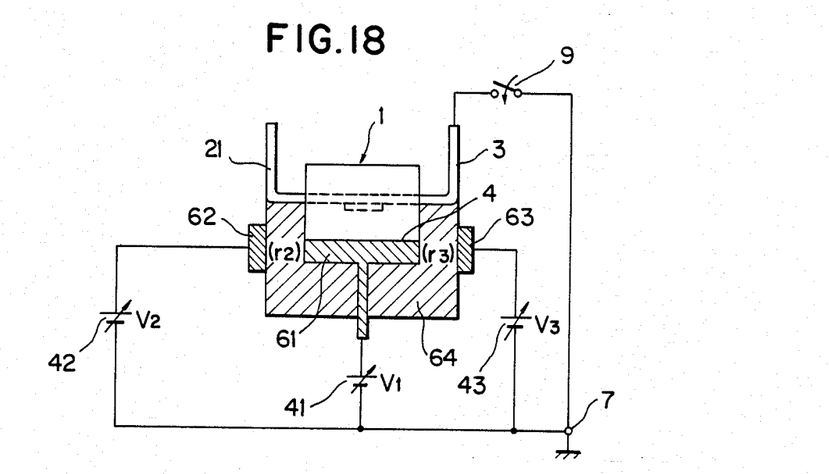
FIG. 18 is a schematic view showing another embodiment of the apparatus according to the present invention.

FIG. 18 is a schematic view showing another embodiment of the apparatus according to the present invention.

Prescribed voltage $V_1$ is applied to the package surface of a semiconductor device 1 from a metal electrode 61 electrically connected with the first DC voltage source 41. The first DC voltage source 41, the second DC voltage source 42, and the third DC voltage source 43 are electrically connected to a common resistor 64 electrically connected with the input/output terminal 3 and the voltage source terminal 21, and the second DC voltage source 42 is set to prescribed voltage $V_2$ and the third DC voltage source 43 set to prescribed voltage $V_3$. Here, the resistor 64 and a metal electrode 62 are arranged so that resistance $r_2$ between the source terminal 21 and the second DC voltage source 42 satisfies a relation $r_2 > 100\ R_E$ based on FIG. 15.

Then, the reference potential electrode 7 and the input/output terminal 3 are short-circuited via the switch 9 for effecting the electrostatic breakdown testing of the semiconductor device 1.

According to the present embodiment, a discharge phenomenon through an air gap formed between the metal electrode 61 and the input/output terminal 3 or the voltage source terminal 21 is prevented from being produced when the switch 9 is switched on, and the electrostatic breakdown testing described above is made possible even if the voltage $V_1$ from the first DC voltage source 41 is increased.

According to the present invention, as described in detail in the embodiments, voltage $V_1$ is applied to the package surface of a semiconductor device to be tested via the metal electrode, while prescribed voltages $V_2$ and $V_3$ are applied to the input/output terminal or the voltage source terminal of the semiconductor device via resistance $r_2$ and $r_3$ each having a prescribed range. Hereby, when the prescribed voltage $V_1$ is applied from the DC voltage source to the package surface via the metal electrode, the semiconductor device is not floated from the reference potential electrode. Thus, testing conditions can be prevented from changing due to the variations of the input/output capacitance and the back capacitance. In addition, with the voltages $V_2$ and $V_3$ being properly, a breakdown phenomenon by the charged device model in a process where the back capacitance is existent can be reproduced whatever test environment follows. Moreover, a charged voltage reference can be set with ease for each process and for each semiconductor device for preventing a breakdown phenomenon by the charged device model from being produced in an actual assembly process.

In such a manner, the present invention can provide the electrostatic breakdown testing method and the apparatus therefor with high reliability, which are not affected by test environments but rather can create test conditions fitted to the test environments.

Although certain preferred embodiments have been shown and described, it should be understood that many changes and modifications may be made therein without departing from the scope of the appended claims.

What is claimed is:

1. A method for testing the susceptibility of a semiconductor device to damage due to discharge of electrostatic charge on a dielectric package of the device, comprising the steps of:
   (a) connecting a switch in series between an input/output terminal of the device and a reference potential source;
   (b) applying a first potential to a surface of the dielectric package to electrically charge the dielectric package, while keeping the switch in an open state;
   (c) applying a second potential to the input/output terminal through a resistor means, while keeping the switch maintained in an open state, so that a variation of an electrostatic capacitance between the reference potential source and the input/output terminal does not affect a potential of the input/output terminal;
   (d) applying a third potential to a power source terminal of the device through a resistor means, while keeping the switch maintained in an open state, so that a variation of an electrostatic capacitance between the reference potential source and the power source terminal does not affect a potential of the power source terminal; and (e) closing the switch to discharge a charge from the input/output terminal to the reference potential source.

2. An apparatus for testing the susceptibility of a semiconductor device to damage due to a discharge of electrostatic charge on a package of the device, the semiconductor device having a dielectric package, a power source terminal and an input/output terminal, the apparatus comprising:
   (a) a switch connected in series between the input/output terminal of the device and a reference potential source;
   (b) a first means for applying a first potential to a surface of the dielectric package;
   (c) a second means for applying a second potential to the power source terminal; and
   (d) a third means for applying a third potential to the input/output terminal,
   wherein the switch operates to discharge the dielectric package, and whereby the second means and the third means eliminate the effects of a back capacitance and an input/output capacitance, respectively.

3. An apparatus according to claim 2, wherein said first means comprises a DC voltage source connected to the surface of the dielectric package.

4. An apparatus according to claim 2, wherein said second means comprises a DC voltage source and a resistor means, the resistor means connected between the DC voltage source and the power source terminal.

5. An apparatus according to claim 2, wherein said third means comprises a DC voltage source and a resistor means, the resistor means connected between the DC voltage source and the input/output terminal.

6. An apparatus for testing the susceptibility of a semiconductor device to damage due to discharge of electrostatic charge, the semiconductor device comprising a dielectric package, a power source terminal and an input/output terminal, and the semiconductor device having, when in a state of testing, an input/output capacitance between a reference potential source and the input/output terminal and a back capacitance between the reference potential source and the power source terminal, the apparatus comprising:
   (a) a switch connected in series between the input/output terminal and the reference potential source;
   (b) a first DC voltage source connected to a surface of the dielectric package, the first DC voltage source applying a first potential to the package;
   (c) a second DC voltage source for applying a second potential to the power source terminal;
   (d) a first resistor connected between the power source terminal and the second DC voltage source;
   (e) a third DC voltage source for applying a third potential to the input/output terminal; and
   (f) a second resistor connected between the input/output terminal and the third DC voltage source,
   wherein the switch operates to discharge the dielectric package, and whereby the second DC voltage source and the third DC voltage source eliminate the effects of the back capacitance and the input/output capacitance, respectively.

7. An apparatus according to claim 6, wherein the second potential of the second DC voltage source is equal to the first potential of the first DC voltage source.

8. An apparatus according to claim 6, wherein the third potential of the third DC voltage source is equal to the first potential of the first DC voltage source.

9. An apparatus according to claim 6, wherein the semiconductor device further comprises an MOS device which has characteristics equivalent to that of an input protective diode, a gate insulating film of an MOS transistor and an input protective resistor.

10. An apparatus according to claim 9, wherein the second DC voltage source provides a voltage $V_2$ represented as follows:

$$V_2 = [C_p/C_B + C_p)]V_1$$

wherein $V_1$ is a voltage applied by the first DC voltage source, $C_p$ is a capacitance value of the dielectric package, and $C_B$ is a capacitance value of the back capacitance.

11. An apparatus according to claim 9, wherein the second resistor has a resistance value that is more than 100 times larger than a resistance value of the input protective resistor.

12. An apparatus according to claim 9, wherein a resistance value of the second resistor is more than about $10^6 \Omega$.

13. An apparatus according to claim 9, wherein the third DC voltage source provides a voltage $V_3$ represented as follows:

$$V_3 = \frac{C_{ox}C_p}{C_pC_{ox} + C_IC_{ox} + C_IC_p} V_1$$

$$[\text{if } \frac{C_IC_p}{C_pC_{ox} + C_IC_{ox} + C_IC_P} V_1 < V_f]$$

$$V_3 = \frac{C_p}{C_p + C_I} (V_1 - V_f)$$

$$[\text{if } \frac{C_IC_p}{C_pC_{ox} + C_IC_{ox} + C_IC_P} V_1 > V_f]$$

wherein $V_1$ is a voltage applied by the first DC voltage source, $V_f$ is a threshold voltage of the input protective diode, $C_p$ is a capacitance value of the dielectric package, $C_{ox}$ is a capacitance value of the gate insulating film, and $C_I$ is a capacitance value of the input/output capacitance.

* * * * *